(12) United States Patent
Yamamoto et al.

(10) Patent No.: US 7,714,979 B2
(45) Date of Patent: May 11, 2010

(54) SUBSTRATE PROCESSING APPARATUS

(75) Inventors: Taro Yamamoto, Koshi (JP); Hideo Funakoshi, Koshi (JP); Yuichiro Inatomi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 17 days.

(21) Appl. No.: 12/250,902

(22) Filed: Oct. 14, 2008

(65) Prior Publication Data

US 2009/0128787 A1    May 21, 2009

(30) Foreign Application Priority Data

Nov. 19, 2007    (JP)    ............... 2007-298960

(51) Int. Cl.
G03B 27/32    (2006.01)
G03D 5/00    (2006.01)
(52) U.S. Cl. ........................................ 355/27; 396/611
(58) Field of Classification Search .................. 355/27, 355/30, 53; 396/611; 118/52, 58; 134/61
See application file for complete search history.

(56) References Cited

U.S. PATENT DOCUMENTS 7,497,908 B2 * 3/2009 Mizuno et al. ................ 118/52
7,553,374 B2 * 6/2009 Hamada et al. ............... 118/62

FOREIGN PATENT DOCUMENTS

JP    2003-234286    8/2003
JP    2005-19969    1/2005

* cited by examiner

*Primary Examiner*—Hung Henry Nguyen
(74) *Attorney, Agent, or Firm*—Oblon, Spivak, McClelland, Maier & Neustadt, L.L.P.

(57) ABSTRACT

A substrate processing apparatus enables an efficient collection of a solvent vapor discharged via a nozzle onto a wafer on which a resist pattern is formed. A retaining base that retains the wafer is moved relative to the nozzle, which includes a nozzle head. A pair of leakage preventing portions are disposed opposite to each other across the nozzle head. Each of the leakage preventing portions has an opening via which the solvent vapor discharged out of the discharge opening can be sucked, or a solvent vapor blocking gas can be discharged selectively. A solvent vapor supply source and a gas supply source are switchably connected to the supply opening of the nozzle head via a first switching valve. An exhaust pump and a solvent-vapor-blocking gas supply source are switchably connected to the openings of the leakage preventing portions via a second switching valve.

9 Claims, 14 Drawing Sheets

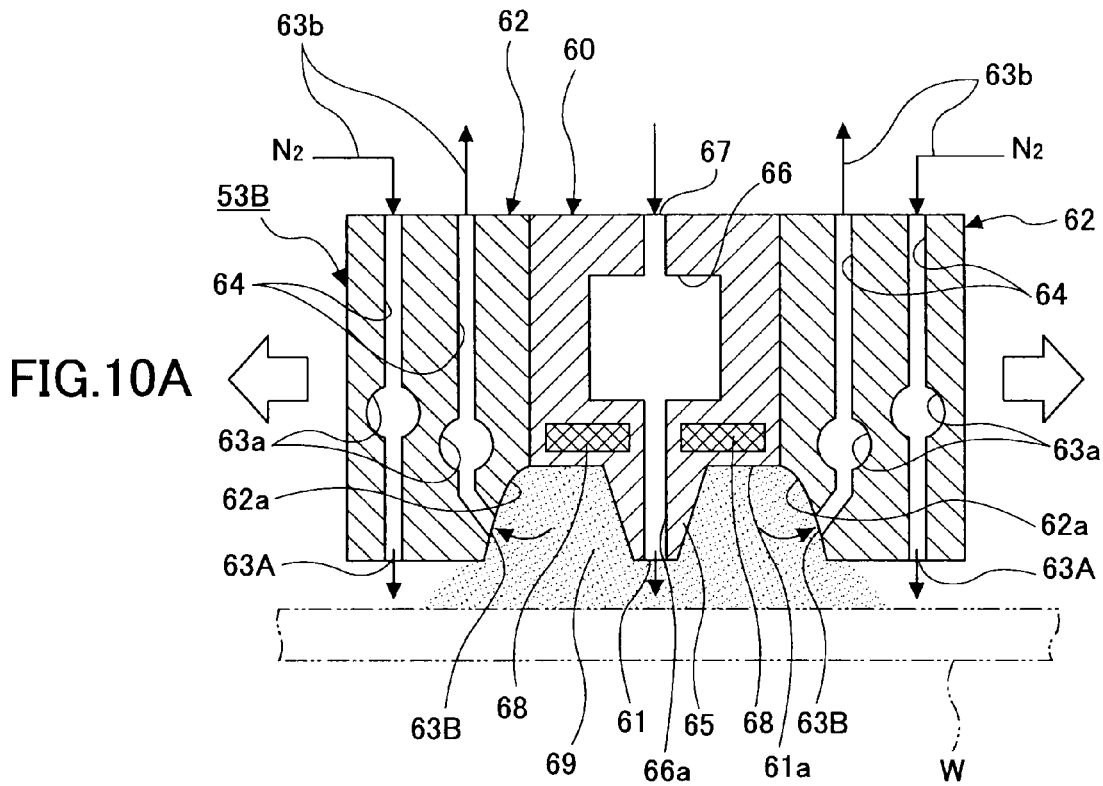
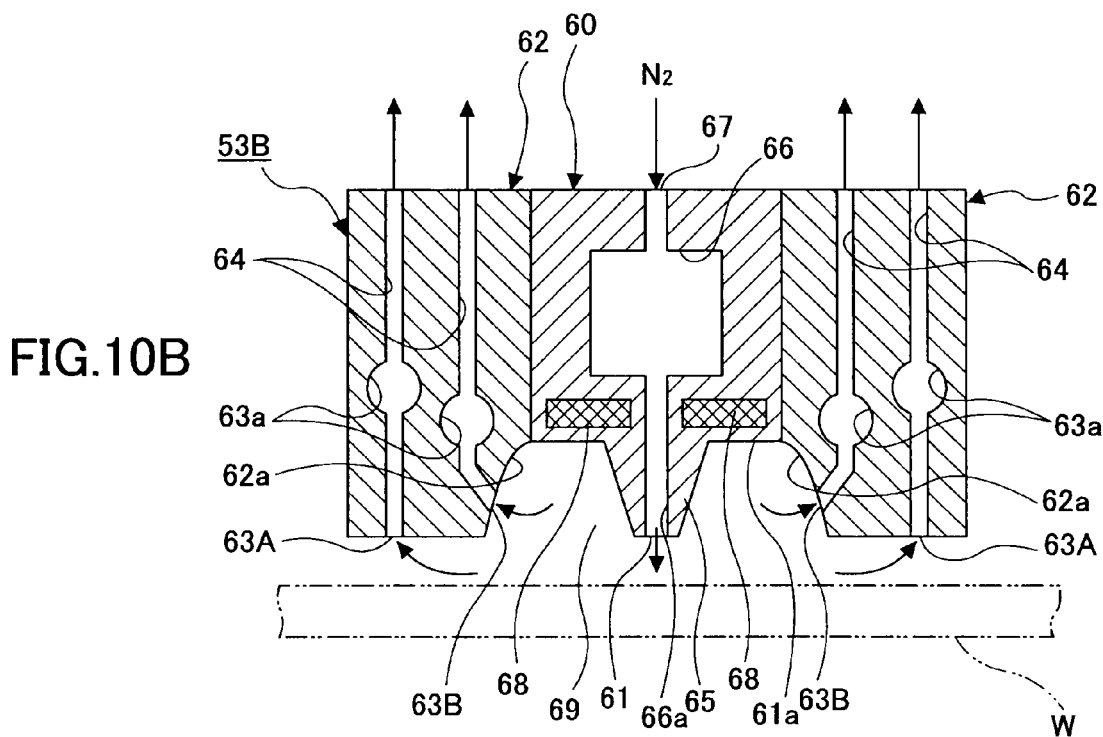

SUBSTRATE PROCESSING APPARATUS

BACKGROUND OF THE INVENTION

1. Field of the Invention

The present invention generally relates to a substrate processing apparatus for improving a surface roughness on a resist film on a substrate, such as a semiconductor wafer.

2. Description of the Related Art

Generally, the photolithography step in a semiconductor device manufacturing process includes a resist application process, an exposure process, a developing process, and an etching process. In the resist application process, a resist solution is applied to an underlayer film on a semiconductor wafer, thereby forming a resist film. In the exposure process, the wafer surface is exposed to light to form a predetermined circuit pattern thereon. In the developing process, the exposed wafer is developed using a developing solution. In the etching process, the underlayer film or the like on the wafer is etched.

On the surface of the resist pattern after the aforementioned developing process, multiple lines appear in the horizontal and vertical directions on the side wall surfaces of the resist pattern due to the wave property of light (with the wavelength of 248 nm in the case of KrF and 193 nm in the case of ArF), with which the wafer surface is irradiated during the exposure process. These lines produce surface roughness called line width roughness (LWR) and line edge roughness (LER) on the resist pattern. When there is such roughness on the resist pattern surface, etching the underlayer film using the resist pattern as a mask causes the appearance of lines or other roughness on the underlayer film corresponding to the lines on the resist pattern. Thus, the lines or other roughness on the resist pattern prevent the formation of a precise circuit pattern and the manufacture of semiconductor devices with required quality.

The applicants have proposed a technology to overcome the aforementioned problems of LWR and LER. The technology, which is a smoothing process, employs a resist solvent vapor to dissolve and smooth the upper-most surface of the resist pattern (Japanese Laid-Open Patent Application No. 2005-19969; see the claims and FIGS. 4 and 5 in particular).

In accordance with this smoothing process, the solvent vapor is discharged via a nozzle onto the surface of a substrate having a resist pattern that has been exposed and developed. The solvent vapor swells the resist pattern and flattens the surface roughness.

In this smoothing process, in order to prevent the diffusion of the solvent vapor atmosphere within equipment, considerations must be given to the air-tight sealing and evacuation of the smoothing processing apparatus (module), and other safety precautions such as explosion proofing. An exhaust cup is typically provided within the apparatus so as to prevent the diffusion of the solvent vapor atmosphere within the apparatus.

However, it is difficult with the exhaust cup alone to reliably collect the solvent vapor discharged out of the nozzle, and the solvent vapor may still leak within the apparatus. Furthermore, prevention of diffusion of the solvent vapor from within the apparatus to the outside requires a sufficient air-tight sealing of the module.

When the solvent vapor remains in the nozzle, this may interfere with the subsequent processes. Thus, the solvent vapor used in a process needs to be collected without delay.

SUMMARY OF THE INVENTION

It is a general object of the present invention to provide an image processing apparatus in which one or more of the aforementioned problems of the related art are eliminated.

A more specific object of the invention is to provide a substrate processing apparatus in which a solvent vapor discharged out of a nozzle is collected without delay by the nozzle itself to prevent the leakage of the solvent vapor outside the nozzle. Thus, the exhaust mechanism based on an exhaust cup and the air-tight sealing of a module can be simplified, and an improved process efficiency is achieved.

In one embodiment, the invention provides a substrate processing apparatus comprising a substrate retaining base configured to retain a substrate with a surface facing upward, wherein a resist pattern is formed on the surface that is subjected to an exposure process and a developing process; a nozzle configured to discharge a solvent vapor onto the surface of the substrate in order to swell the resist pattern; and a moving mechanism configured to move the substrate retaining base and the nozzle in parallel relative to each other. The nozzle includes a nozzle head having a solvent vapor supply opening and a discharge opening that is communicated with the solvent vapor supply opening and that opens downward. The nozzle further includes a pair of leakage preventing portions disposed at opposite positions across the nozzle head. Each of the leakage preventing portions has an opening via which at least the solvent vapor discharged out of the discharge opening can be sucked, and a communicating channel in communication with the opening of the leakage preventing portion. A solvent vapor supply source and an inert gas supply source are switchably connected to the supply opening of the nozzle head via a first switching valve. An exhaust mechanism and a solvent-vapor-blocking gas supply source are switchably connected to the opening of each of the leakage preventing portions via a second switching valve.

Thus, during processing, the solvent vapor used can be collected, and the leakage of solvent vapor outside the nozzle can be blocked. After the processing, the inert gas is supplied to the discharge opening of the nozzle, and the inert gas can be collected via the openings of the leakage preventing portions and the communicating channels. Thus, the solvent vapor that remains in the nozzle after processing can be substituted with the inert gas, whereby the time before the subsequent process can be started can be reduced. Thus, the discharged solvent vapor is collected by the nozzle itself and its leakage outside the nozzle is prevented. Therefore, the exhaust mechanism using an exhaust cup or the sealing of the module can be simplified, and the size of the apparatus can be reduced. Because the used solvent vapor can be swiftly collected, improved process efficiency can be achieved.

In a preferred embodiment, a lower portion of each of the leakage preventing portions extends downward beyond the discharge opening of the nozzle head. A surface of each of the leakage preventing portions that is continuous with a bottom surface of the nozzle head is formed as a concave-curved surface in which the opening of the leakage preventing portion is located.

Thus, a solvent vapor atmosphere can be formed between the nozzle and the substrate, and the leakage of solvent vapor outside the nozzle can be reliably prevented. Thus, the prevention of leakage of solvent vapor outside the nozzle can be further ensured. By forming the surface that is continuous with the bottom surface of the nozzle head as a concave-curved surface, the accumulation of solvent vapor between the nozzle and the substrate can be prevented, whereby the remaining solvent vapor can be reliably collected.

In another embodiment, the substrate processing apparatus includes a dew-condensation-preventing heater disposed on either side of the discharge opening in the nozzle head.

Thus, dew condensation at the discharge opening portion of the nozzle due to solvent vapor can be prevented, so that a decrease in process accuracy due to dew condensation, which particularly tends to occur when an organic solvent vapor with high concentrations is used, can be prevented.

In another preferred embodiment, the leakage preventing portions are movable vertically with respect to the nozzle head.

Thus, because the distance or interval between the discharge opening of the nozzle or the substrate surface and the lower edge of the leakage preventing portion can be adjusted, the supply or supply pressure of solvent vapor and the air flow at the supply portion can be adjusted.

In another preferred embodiment, each of the leakage preventing portions has an inner opening and an outer opening disposed along a direction of movement of the nozzle. The outer opening of the leakage preventing portion is switchably connected to the exhaust mechanism and the solvent-vapor-blocking gas supply source via the second valve. The inner opening of the leakage preventing portion is connected to the exhaust mechanism.

Thus, the solvent-vapor-blocking gas is discharged out of the outer openings in the leakage preventing portions, thus forming a blocking air curtain. Thus, the leakage of the solvent vapor discharged out of the discharge opening outside the nozzle can be further prevented.

In a preferred embodiment, the leakage preventing portions are formed of a cover member with which the nozzle head is covered, leaving an opening and a communicating channel between the nozzle head and the cover member. A top member of the cover member has a communicating opening communicated with the supply opening of the nozzle head. The cover member and the nozzle head may be relatively movable vertically and horizontally, and the communicating opening in the top member of the cover member and the supply opening in the nozzle head may be connected via a communicating piping that can be expanded, compressed, and bent.

In this embodiment, the opening and the communicating channel can be readily formed by covering the nozzle head with the cover member. The cover member and the nozzle head are relatively movable vertically and horizontally. The communicating opening in the top member of the cover member is connected with the supply opening of the nozzle head via the flexible communicating piping. Thus, the widths of the opening and the communicating channel can be adjusted, and the distance or interval between the discharge opening of the nozzle or the substrate surface and the lower edge of the leakage preventing portion can be adjusted, so that the supply pressure of solvent vapor and its flow from supply to exhaust can be adjusted.

In another preferred embodiment, the discharge opening of the nozzle head is displaced forwardly of a direction of movement of the nozzle.

Thus, by discharging the solvent vapor forwardly of the direction of movement of the nozzle while the nozzle and the substrate are moved relative to each other, the solvent vapor can contact the substrate surface uniformly, whereby the processing accuracy can be further improved.

In another preferred embodiment, the substrate processing apparatus further comprises a control unit configured to control the moving mechanism, the first switching valve, the second switching valve, and the exhaust mechanism.

Thus, the apparatus can automatically perform the operation of collecting the discharged solvent vapor via the opening and the communicating channel, the operation of discharging the solvent vapor blocking gas via the opening toward the substrate, and the operation of supplying an inert gas via the discharge opening after processing in order to collect the inert gas via the opening and the communicating channel, whereby a further enhanced process efficiency can be achieved.

BRIEF DESCRIPTION OF THE DRAWINGS

These and other objects, features and advantages of the invention will be apparent to those skilled in the art from the following detailed description of the invention, when read in conjunction with the accompanying drawings in which:

FIG. 10A shows a schematic cross section of the solvent vapor discharge nozzle according to Embodiment 3 during a processing;

FIG. 10B shows a schematic cross section of the solvent vapor discharge nozzle according to Embodiment 3 after the processing;

DETAILED DESCRIPTION OF THE PREFERRED EMBODIMENTS

Hereafter, various preferred embodiments of the present invention are described with reference to the attached drawings. First, a description is given of a resist applying/developing process system for semiconductor wafers to which a substrate processing apparatus according to an embodiment of the present invention is applied.

Figure 1:
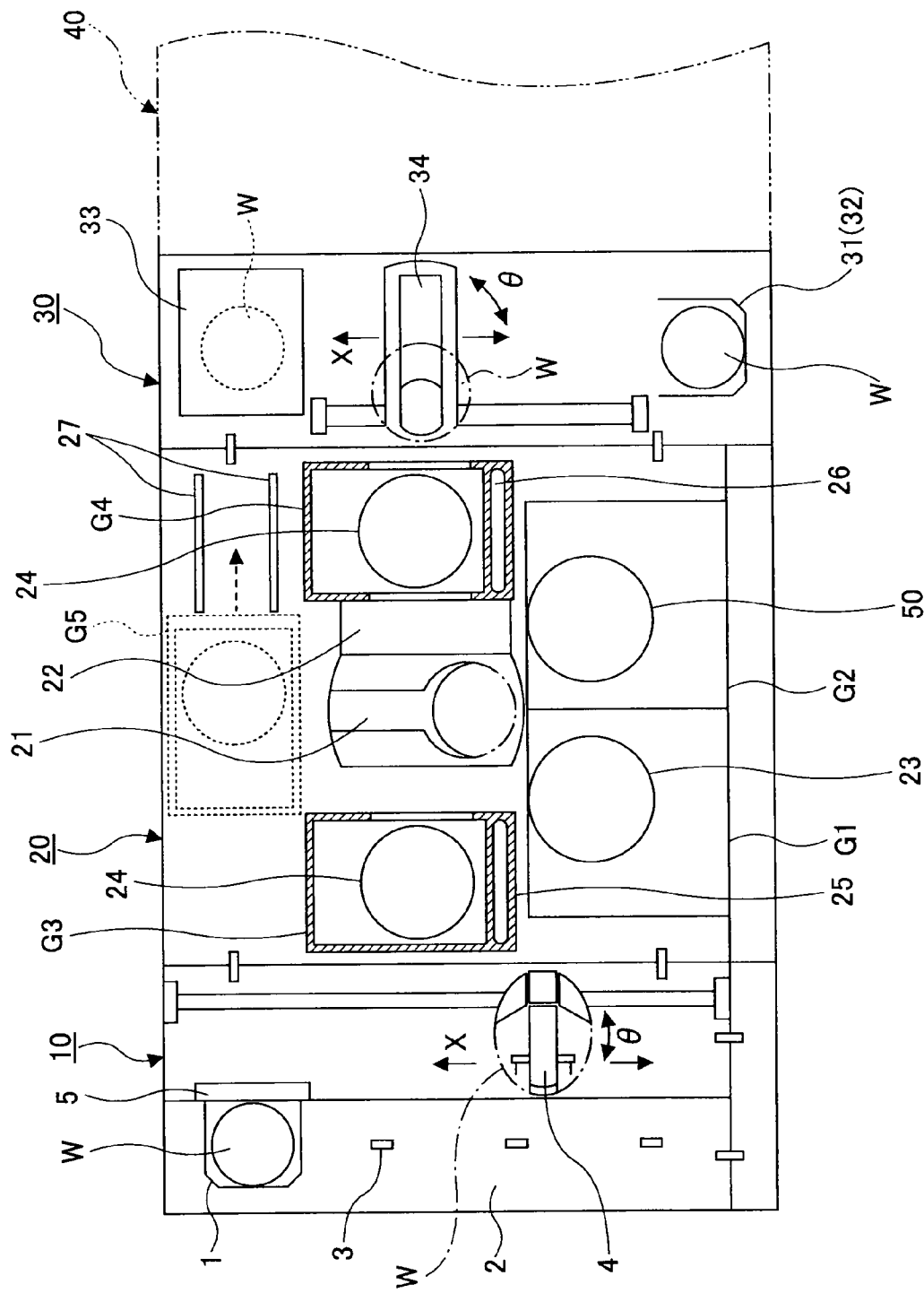
FIG. 1 shows a schematic plan view of a resist applying/developing process system to which a substrate processing apparatus according to an embodiment of the present invention is applied.
Figure 2:
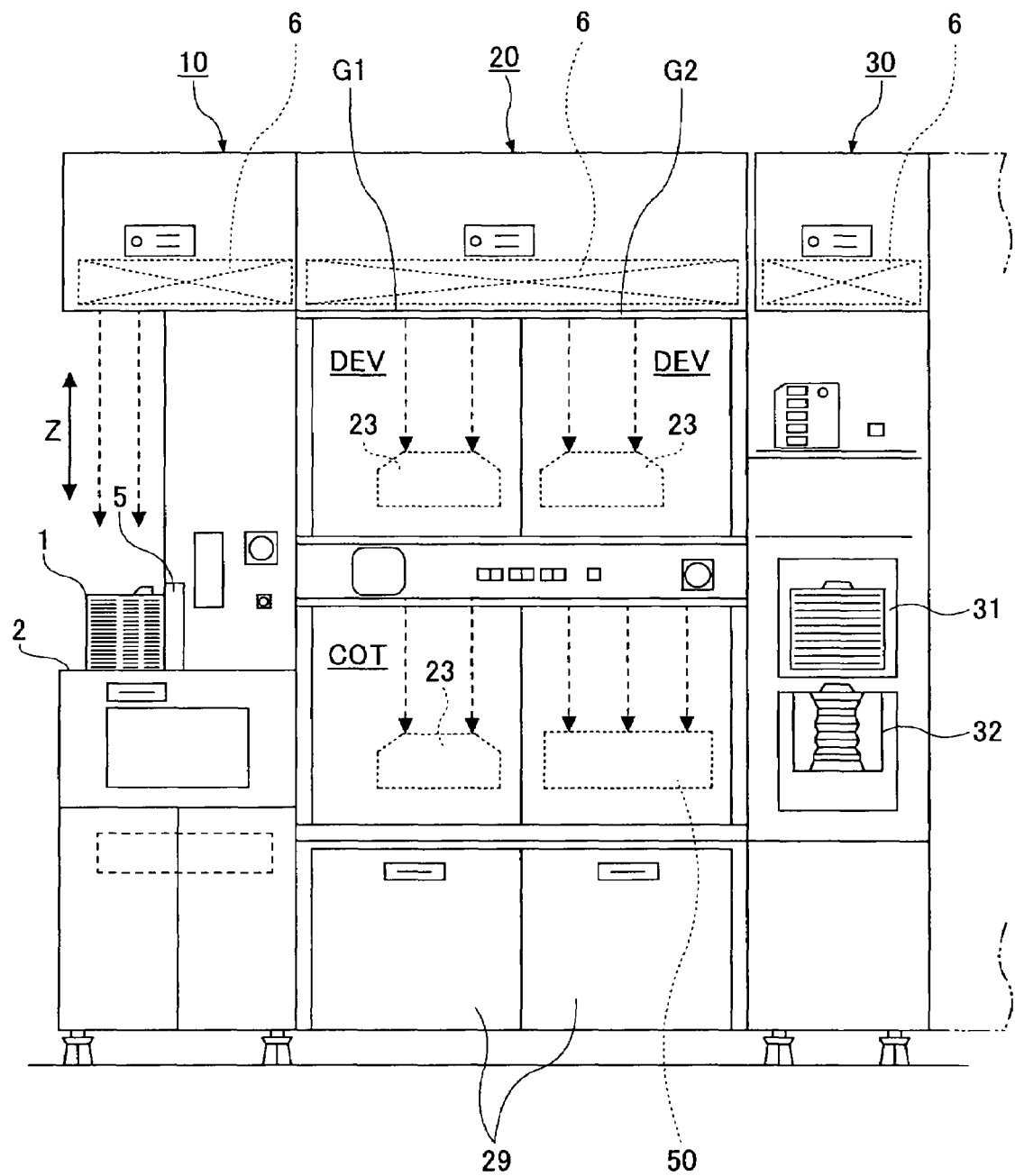
FIG. 2 shows a schematic front view of the resist applying/developing process system.
Figure 3:
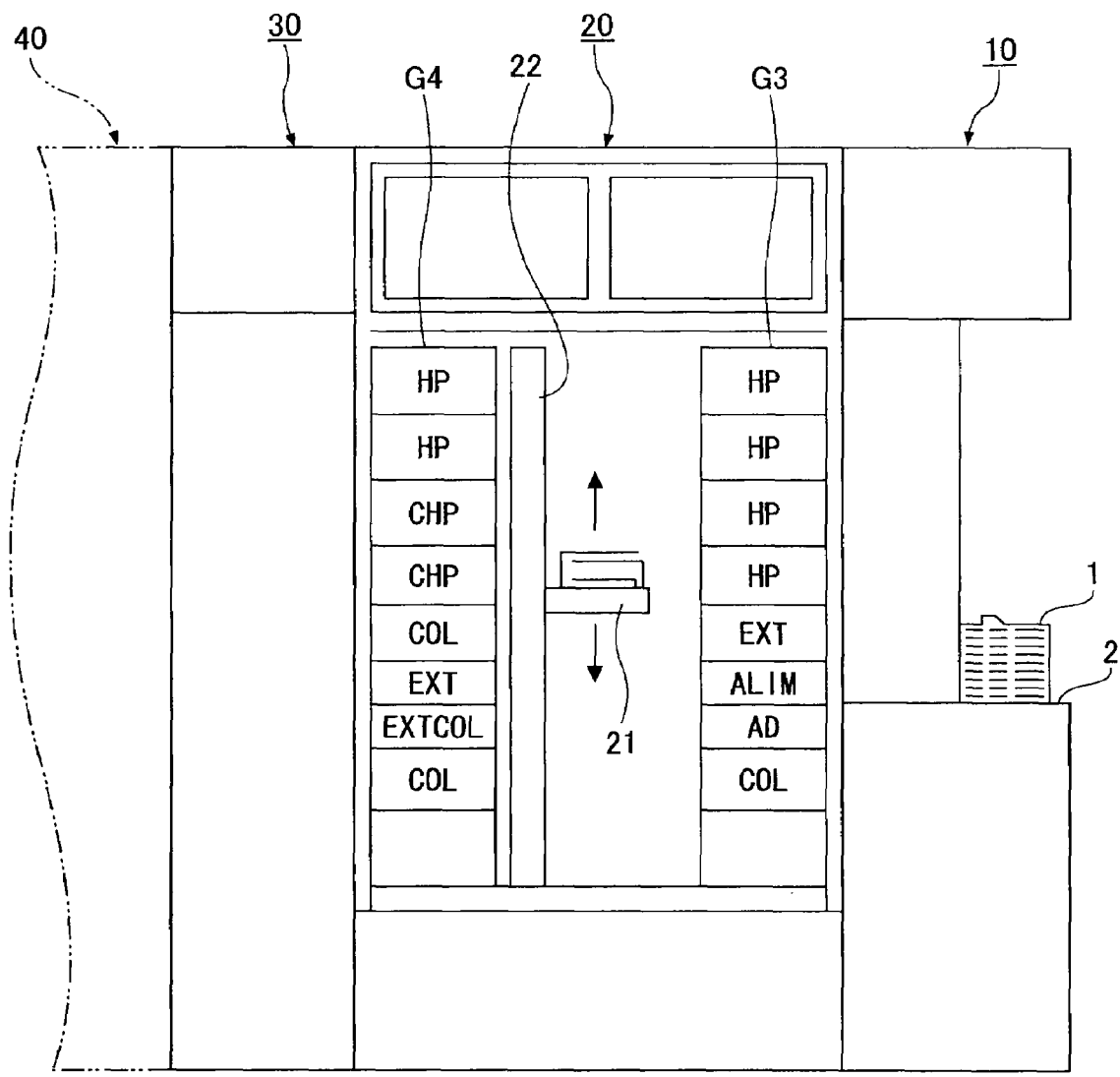
FIG. 3 shows a schematic rear view of the resist applying/developing process system.

FIG. 1 shows a schematic plan view of the resist applying/developing process system. FIG. 2 shows a front view of the system. FIG. 3 is a rear view of the system.

The resist applying/developing process system includes a cassette station 10 (transfer unit) a process station 20, and an interface unit 30. These units form a main portion of the system.

The cassette station 10 includes a wafer cassette 1 with which to load or unload a number of semiconductor wafers W to be processed into or out of the system in units of 25, for example. The wafers W may also be loaded or unloaded into or out of the wafer cassette 1 in the cassette station 10.

The process station 20 includes various single-wafer process units for performing predetermined processes on the wafers W one by one in the applying/developing steps. The process units are disposed at predetermined positions in multiple stages.

The interface unit 30 is configured to deliver or receive the wafers W to or from an exposure apparatus 40 that is disposed adjacent to the process station 20.

In the cassette station 10, as shown in FIG. 1, a plurality of, such as four, wafer cassettes 1 with lids are disposed at the positions of projections 3 on a cassette mount 2 and arranged in a row along the horizontal X direction, with a wafer inlet/outlet of each wafer cassette 1 facing the process station 20. A lid open/close device 5 is disposed facing each wafer cassette 1.

Wafer transfer tweezers 4 are also provided in the cassette station 10, which are capable of moving in the cassette-arranged direction (X direction) and a vertical direction along which the wafers W are arranged (Z direction), so that the wafers W can be selectively transferred to each wafer cassette 1. The wafer transfer tweezers 4 are rotatable in a θ direction so that it can transfer the wafer W to an alignment unit (ALIM) and an extension unit (EXT) that belong to the multi-stage units of the third group G3 on the side of the process station 20, which is described later.

The process station 20 includes a main wafer transfer mechanism 21 of the vertical transfer type disposed at the center that can be moved vertically by a moving mechanism 22, as shown in FIG. 1. Around the main wafer transfer mechanism 21, there are arranged all of the process units in one or more groups in multiple stages. In the example shown, five groups of G1, G2, G3, and G4 are arranged in multiple stages. The multi-stage units of the first and the second groups G1 and G2 are disposed side by side on the front side of the system. The multi-stage unit of the third group G3 is disposed adjacent the cassette station 10. The multi-stage unit of the fourth group G4 is disposed adjacent the interface unit 30. Multi-stage units of a fifth group G5 may also be disposed in the back.

In this case, as shown in FIG. 2, in the first group G1, a developing unit (DEV) and a resist applying unit (COT) are arranged in two stages vertically. The developing unit (DEV) is used for developing a resist pattern by having the wafer W and a developing solution supply unit (not shown) facing each other in a cup (container) 23. The resist applying unit (COT) is used for performing a predetermined process by placing the wafer W on a spin chuck (not shown) are arranged in two stages vertically.

In the second group G2, a smoothing processing apparatus 50 ("smoothing apparatus 50") as a substrate processing apparatus according to an embodiment of the present embodiment, and a developing unit (DEV) are arranged in two stages vertically. The resist applying unit (COT) and the smoothing apparatus 50 are disposed in the lower stage in consideration of the discharge of resist solutions or the exhausting of resist solvents both mechanically and in terms of maintenance. Alternatively, the resist applying unit (COT) or the smoothing apparatus 50 may be disposed in the upper stage as needed.

In the third group G3, as shown in FIG. 3, there are arranged eight stages of oven-type process units for performing predetermined processes by placing the wafer W on a wafer mount 24. These units include, arranged in order from the bottom, a cooling unit (COL) for cooling the wafer W; an adhesion unit (AD) for performing a hydrophobic process on the wafer W; an alignment unit (ALIM) for positioning the wafer W; an extension unit (EXT) for loading or unloading of the wafer W; and four hot plate units (HP) employing heat processing devices for baking the wafer W.

In the fourth group G4, eight stages of oven-type process units are provided. These units include, arranged vertically in order from the bottom, a cooling unit (COL); an extension/cooling unit (EXTCOL); an extension unit (EXT); a cooling unit (COL); two chilling hot plate units (CHP) having a quenching function; and two hot plate units (HP) that employ heat processing devices.

Thus, the cooling units (COL) and the extension/cooling unit (EXTCOL), which handle lower process temperature, are disposed in the lower stages, while the hot plate units (HP), the chilling hot plate units (CHP), and the adhesion unit (AD), which handle higher process temperature, are disposed in the higher stages. In this way, mutual thermal interference between the individual units can be reduced. Alternatively, these units may be disposed in random stages.

As shown in FIG. 1, in the process station 20, ducts 25 and 26 are vertically provided in the side walls of the multi-stage units (oven-type process units) of the third and the fourth groups G3 and G4, adjacent the multi-stage units (spinner-type process units) of the first and the second groups G1 and G2. In these ducts 25 and 26, a downflow of purifying air or temperature-adjusted air is supplied. These duct structures shield the heat generated by the oven-type process units of the third and fourth groups G3 and G4 from reaching the spinner-type process units of the first and the second groups G1 and G2.

In this process system, there may be also provided multi-stage units of the fifth group G5 behind the main wafer transfer mechanism 21, as indicated by dotted lines in FIG. 1. The multi-stage units of the fifth group G5 may be moved along guide rails 27 laterally as seen from the main wafer transfer mechanism 21. Thus, when the multi-stage units of the fifth group G5 are provided, an access space can be obtained by sliding the units so that maintenance work can be readily performed from behind the main wafer transfer mechanism 21.

The interface unit 30 has the same depth as the process station 20 but is smaller in width. At the front of the interface unit 30, a portable pickup cassette 31 and a fixed buffer cassette 32 are disposed in two stages. At the back, an edge exposure apparatus 33 is disposed for exposing the edge portion and an identifying mark region of the wafer W. At the central portion, there is disposed a wafer transfer arm 34. The transfer arm 34 can be moved in the X and Z directions so as to transfer the wafer W to the cassettes 31 and 32 as well as the edge exposure apparatus 33. The transfer arm 34 is also rotatable in the θ direction so that it can transfer the wafer W to the extension unit (EXT) that belongs to the multi-stage units of the fourth group G4 on the process station 20 end, and to a wafer exchange base (not shown) on the side of the adjacent exposure apparatus 40.

Although the thus structured process system is installed in a clean room, even within the system, enhanced levels of cleanness is achieved in the various portions of the system through an efficient vertical laminar flow provided by HEPA filters 6, which may be attached to the ceiling portions.

In the following, the smoothing apparatus 50 is described with reference to FIGS. 4 through 14.

Embodiment 1

Figure 4:
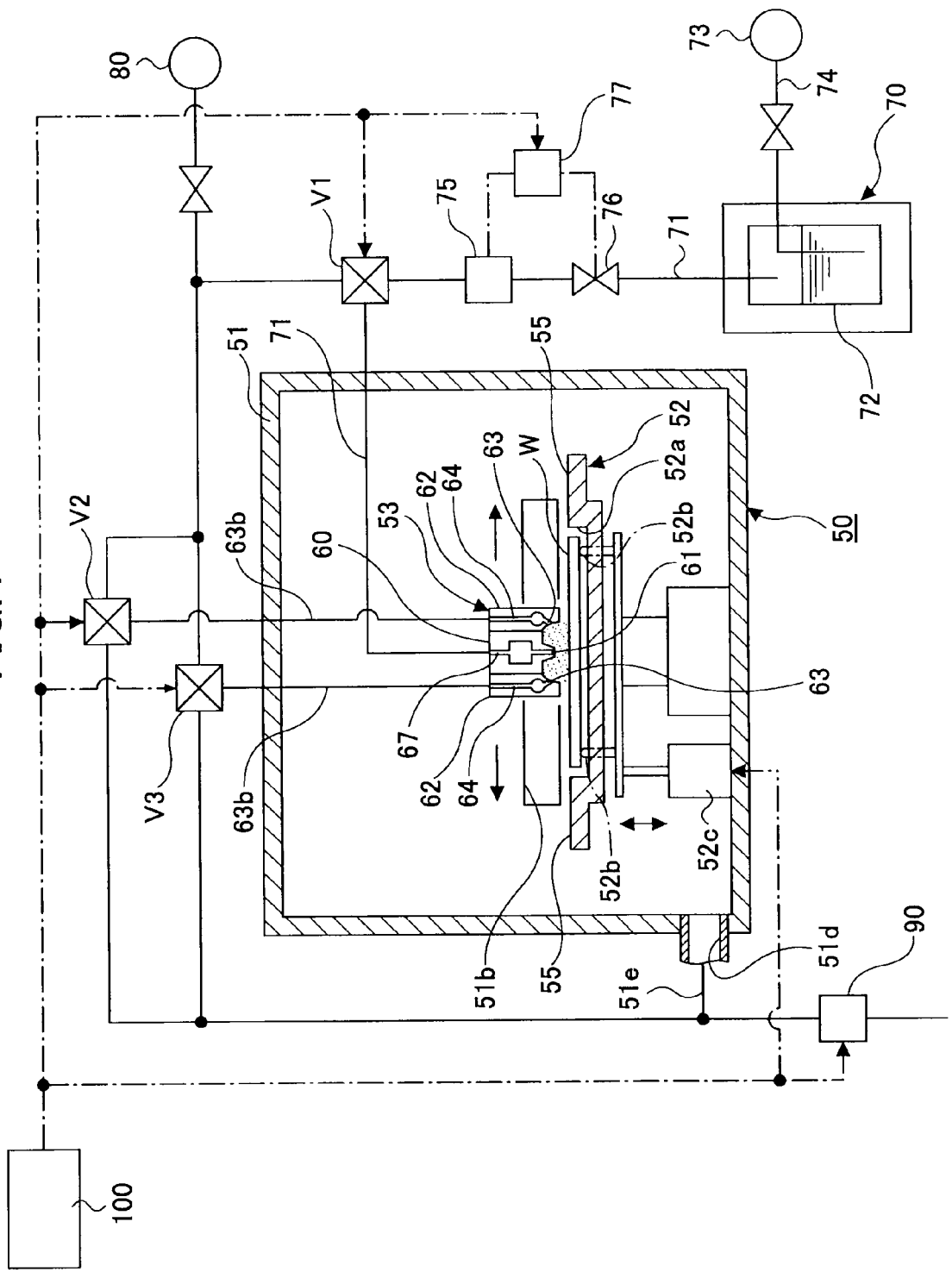
FIG. 4 shows a schematic vertical cross section of a substrate processing apparatus according to Embodiment 1 of the present invention.
Figure 5:
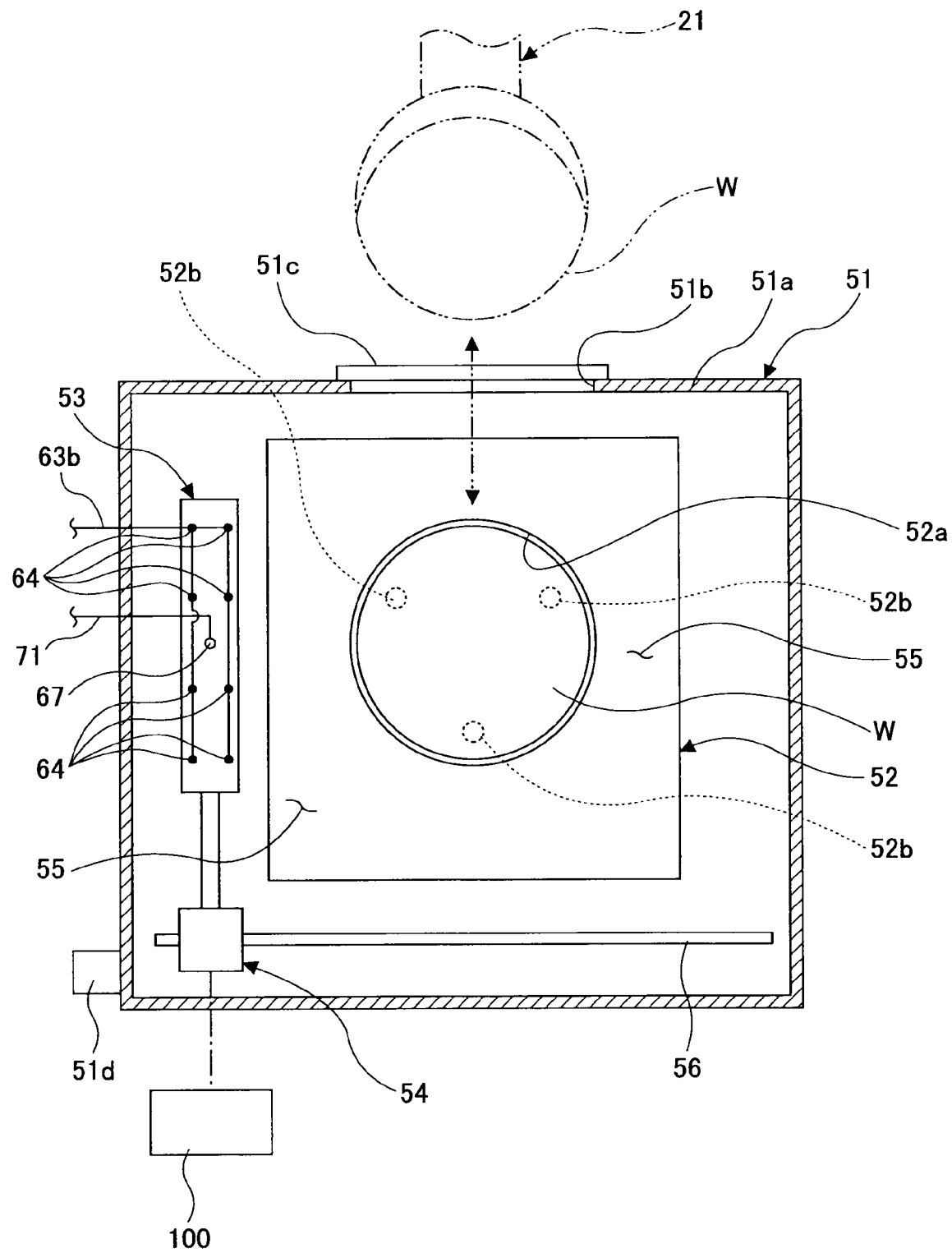
FIG. 5 shows a schematic lateral cross-section of the substrate processing apparatus.

FIG. 4 shows a schematic vertical cross section of a smoothing apparatus 50 according to Embodiment 1. FIG. 5 shows a schematic lateral cross-section of the smoothing apparatus 50.

The smoothing apparatus 50 has a casing 51 in which there are disposed a substrate retaining base 52, a solvent vapor discharge nozzle 53, and a moving mechanism 54.

The retaining base 52 is configured to retain, via suction, a wafer W received from the main wafer transfer mechanism 21 after the developing process, with the processed surface of the wafer facing upward. The nozzle 53 discharges a solvent vapor onto the wafer W surface in order to swell a resist pattern formed on the wafer W surface. The moving mechanism 54 is configured to move the nozzle 53 horizontally from one end of the retaining base 52 to the other.

In the illustrated example, the retaining base 52 has a recessed portion 52a within which the wafer W is retained by suction, supported by support pins 52b. The retaining base 52 is dimensioned such that the upper surface of the wafer W and the upper surface of peripheral portions of the retaining base 52 are substantially level. The support pins 52b can be moved up beyond the surface of the retaining base 52 by a lifting mechanism 52c, so that the wafer W can be received from or delivered to the main wafer transfer mechanism 21 as it enters into the casing 51 via a loading/unloading opening 51b formed in a side wall 51a of the casing 51. The loading/unloading opening 51b is equipped with a shutter 51c that can be opened or closed by an open/close mechanism (not shown).

On each of the opposite edge portions of the retaining base 52, a runup surface 55 for the nozzle 53 extends. By positioning the nozzle 53 on either runup surface 55 before discharging the solvent vapor, the solvent vapor can be stabilized when it is discharged. After the solvent vapor is discharged onto the wafer surface, the discharge of the solvent vapor can be stopped after the nozzle 53 is positioned over the runup surface 55, so that the scattering of the solvent vapor around the retaining base 52 can be prevented.

Figure 6:
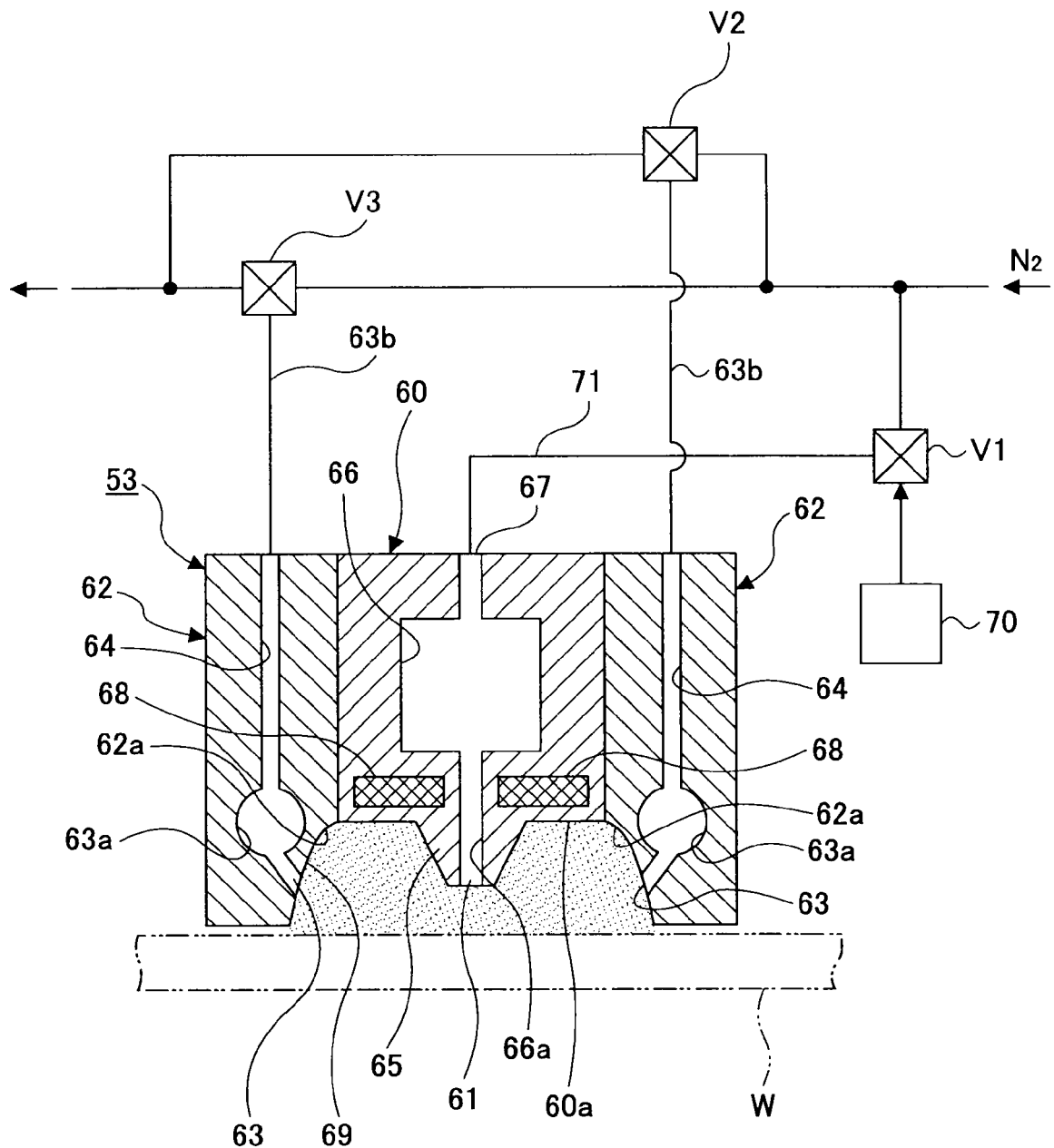
FIG. 6 shows a schematic cross section of a solvent vapor discharge nozzle in the substrate processing apparatus.

The nozzle 53 includes, as shown in FIG. 6, a rectangular nozzle head 60 having a discharge opening 61, which may be a slit longer than the diameter of the wafer W. The nozzle 53 also includes a pair of leakage preventing portions 62 disposed at opposite positions across the nozzle head 60. Each of the leakage preventing portions 62 includes an opening 63 via which the solvent vapor discharged out of the discharge opening 61 can be sucked, and a communicating channel 64 communicated with the opening 63. The opening 63 is formed in the shape of a slit slightly longer than the discharge opening 61.

The nozzle head 60 has a supply portion 65 at the center of its bottom surface, which projects in the shape of an inverted truncated cone. The aforementioned discharge opening 61 is provided in the central portion of the supply portion 65. In the nozzle head 60, there is formed a solvent vapor storing space portion 66 that is communicated with the discharge opening 61 via a communicating channel 66a. In an upper portion of the solvent vapor storing space portion 66, a supply opening 67 that opens on the upper surface of the nozzle head 60 is provided. To the supply opening 67, a solvent vapor supply source 70 and an inert gas supply source, such as a nitrogen (N2) gas supply source 80 as shown in FIG. 4 are switchably connected through a supply piping 71 via a first switching valve V1.

Thus, by communicating the supply opening 67 and the solvent vapor supply source 70 by switching the first switching valve V1, the solvent vapor can be supplied from the solvent vapor supply source 70 and discharged via the discharge opening 61. By switching the first switching valve V1 to communicate the supply opening 67 with the N2 gas supply source 80, an N2 gas can be supplied from the N2 gas supply source 80 and discharged via the discharge opening 61.

The nozzle head 60 also includes a dew-condensation-preventing heater 68 disposed on either side of the discharge opening 61. The heater 68, which may be an electrothermal heater energized by a power supply not shown, is configured to prevent dew condensation at areas near the discharge opening 61 due to the solvent vapor or the N2 gas. The heater 68 may be other than an electrothermal heater; namely, it may be a temperature-adjustable heater configured to cause a flow of a thermal medium having a predetermined adjusted temperature, such as temperature-adjusted water, through a channel provided in the nozzle head 60.

The leakage preventing portions 62 extend downwardly beyond a bottom surface 60a and the supply portion 65 of the nozzle head 60. The leakage preventing portions 62, together with the bottom surface 60a and the supply portion 65 of the nozzle head 60, form a space 69 for the temporal storage of solvent vapor. On the inner surface of each leakage preventing portion 62 adjacent the bottom surface 60a of the nozzle head 60, there is formed a concave-curved surface 62a continuous with the bottom surface 60a of the nozzle head 60. The concave-curved surface 62a prevents the accumulation of the solvent vapor within the space 69.

The openings 63 are provided in the opposite internal surfaces of the leakage preventing portions 62. In each of the leakage preventing portions 62, the opening 63 may be communicated with a plurality of, such as four, communicating channels 64 via a buffer chamber 63a. The communicating channels 64 open on the upper surface of the leakage preventing portion 62. In the illustrated example, the openings 63 are switchably connected with an exhaust mechanism, such as an exhaust pump 90 shown in FIG. 4, and the N2 gas supply source 80 which supplies an N2 solvent vapor blocking gas, via the communicating channels 64 and the intake/supply pipings 63b interposed with a second and a third switching valve V2 and V3.

Thus, by switching the second and the third switching valves V2 and V3 so that the communicating channels 64 and the openings 63 are communicated with the exhaust pump 90, the solvent vapor or the N2 gas discharged out of the discharge opening 61 can be exhausted (collected) via the openings 63. By switching the second and the third switching valves V2 and V3 so that the communicating channels 64 and the openings 63 are communicated with the N2 gas supply source 80, the N2 gas supplied from the N2 gas supply source 80 can be discharged out of the openings 63.

The solvent vapor supply source 70 includes a reservoir tank 72 as shown in FIG. 4 that is connected with the supply piping 71 and in which a fluid solvent is stored. The solvent vapor supply source 70 also includes an N2 gas supply piping 74 connected to an inert nitrogen (N2) gas supply source 73 in order to supply an N2 gas into the reservoir tank 72. The N2 gas supply source 73 may be replaced with the N2 gas supply source 80. By supplying the N2 gas via the N2 gas supply piping 74 to the fluid solvent in the reservoir tank 72, the vaporized solvent within the reservoir tank 72 is conveyed under pressure through the supply piping 71 to the nozzle 53. Examples of the solvent include acetone, propylene glycol monomethyl ether acetate (PGMEA), and N-methyl-2-pyrrolidinone (NMP).

As shown in FIG. 4, the supply piping 71 is equipped with a flow rate sensor 75 for detecting the flow rate of the solvent vapor, and an adjusting valve 76 for adjusting flow rate. The result of detection by the flow rate sensor 75 is outputted to a flow rate control unit 77. The flow rate control unit 77, based on the detection result, adjusts the degree of opening of the adjusting valve 76 so that a predetermined flow rate can be achieved for the solvent vapor that is discharged via the nozzle 53.

In the side at the bottom of the casing 51, there is formed an exhaust outlet 51d as shown in FIGS. 4 and 5, which is connected to the exhaust pump 90 via an exhaust pipe 51e.

The moving mechanism 54 for the nozzle 53 is mounted in such a manner as to be movable along a guide rail 56 disposed in parallel with the retaining base 52. The moving mechanism 54 is electrically connected with a controller 100 so that the moving mechanism 54 can be activated in accordance with a control signal from the controller 100.

The controller 100 is also electrically connected with the aforementioned first, the second, and the third switching valves V1, V2, and V3. Thus, by switching the first, the second, and the third switching valves V1, V2, and V3 based on control signals from the controller 100, either the solvent vapor or the N2 gas can be selectively discharged out of the discharge opening 61, and the solvent vapor or the N2 gas can be sucked (i.e., exhausted and collected) or the N2 gas can be discharged selectively through the openings 63.

Figure 7A:
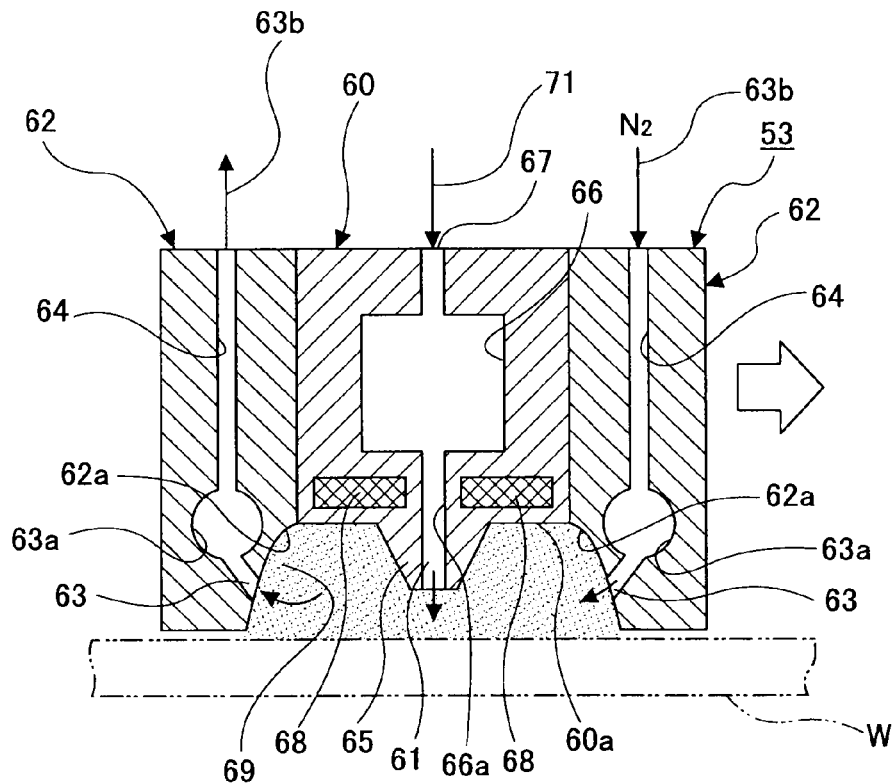
FIG. 7A shows a schematic cross section of the solvent vapor discharge nozzle during a processing.

During processing, as shown in FIG. 7A, the nozzle 53 is moved by the moving mechanism 54 from one end (left) of the retaining base 52 with the wafer W retained thereon to the other end (right). As the nozzle 53 is thus moved, the first switching valve V1 is switched so that the supply opening 67 and the solvent vapor supply source 70 are communicated, whereby the solvent vapor supplied from the solvent vapor supply source 70 is discharged via the discharge opening 61.

Further, the second switching valve V2, which is interposed in the intake/supply piping 63b communicated with the opening 63 of the leakage preventing portion 62 on the side toward which the nozzle 53 is moved, is switched so that the N2 gas supplied from the N2 gas supply source 80 can be discharged via the opening 63.

On the other hand, the third switching valve V3, which is interposed in the intake/supply piping 63b communicated with the opening 63 of the leakage preventing portion 62 that is disposed rearwardly of the direction of movement of the nozzle 53, is switched so that the opening 63 of the trailing leakage preventing portion 62 and the exhaust pump 90 can be communicated, in order to exhaust (collect) the solvent vapor discharged via the discharge opening 61 through the opening 63.

Figure 7B:
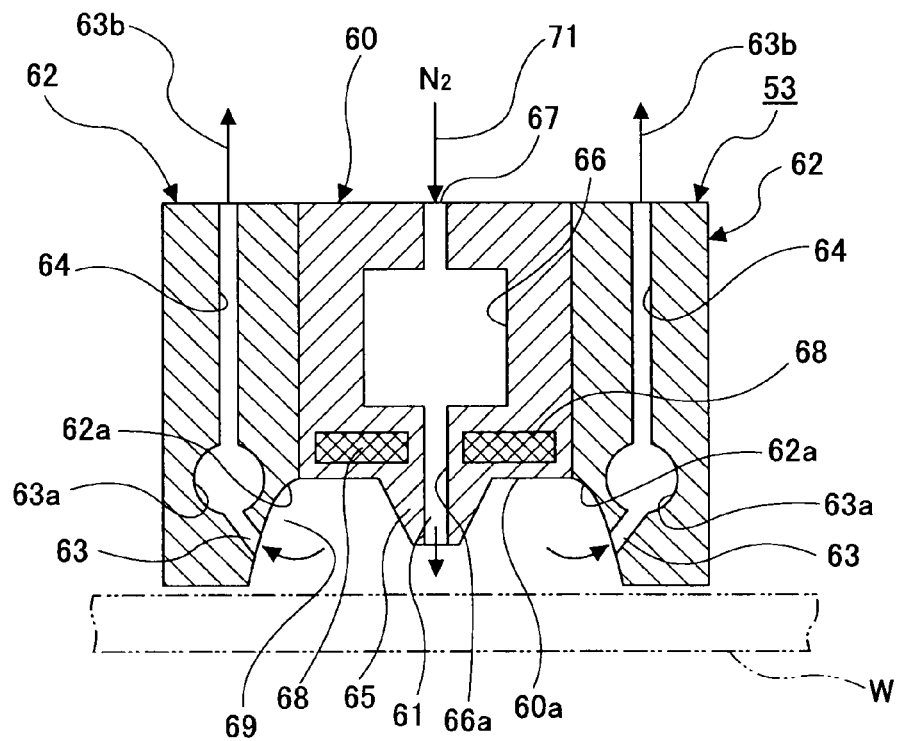
FIG. 7B shows a schematic cross section of the solvent vapor discharge nozzle after the processing.

After the processing, as shown in FIG. 7B, the moving mechanism 54 is deactivated to position the nozzle 53 over the runup surface 55 of the retaining base 52. Then, the first switching valve V1 is switched to communicate the supply opening 67 with the N2 gas supply source 80, so that the N2 gas supplied from the N2 gas supply source 80 can be discharged via the discharge opening 61, thereby substituting the solvent vapor remaining in the discharge opening 61 with the N2 gas. Further, the second switching valve V2 and the third switching valve V3 are switched to communicate the openings 63 of the both leakage preventing portions 62 with the exhaust pump 90, so that the N2 gas discharged via the discharge opening 61 can be exhausted (collected) via the openings 63.

Embodiment 2

Figure 8:
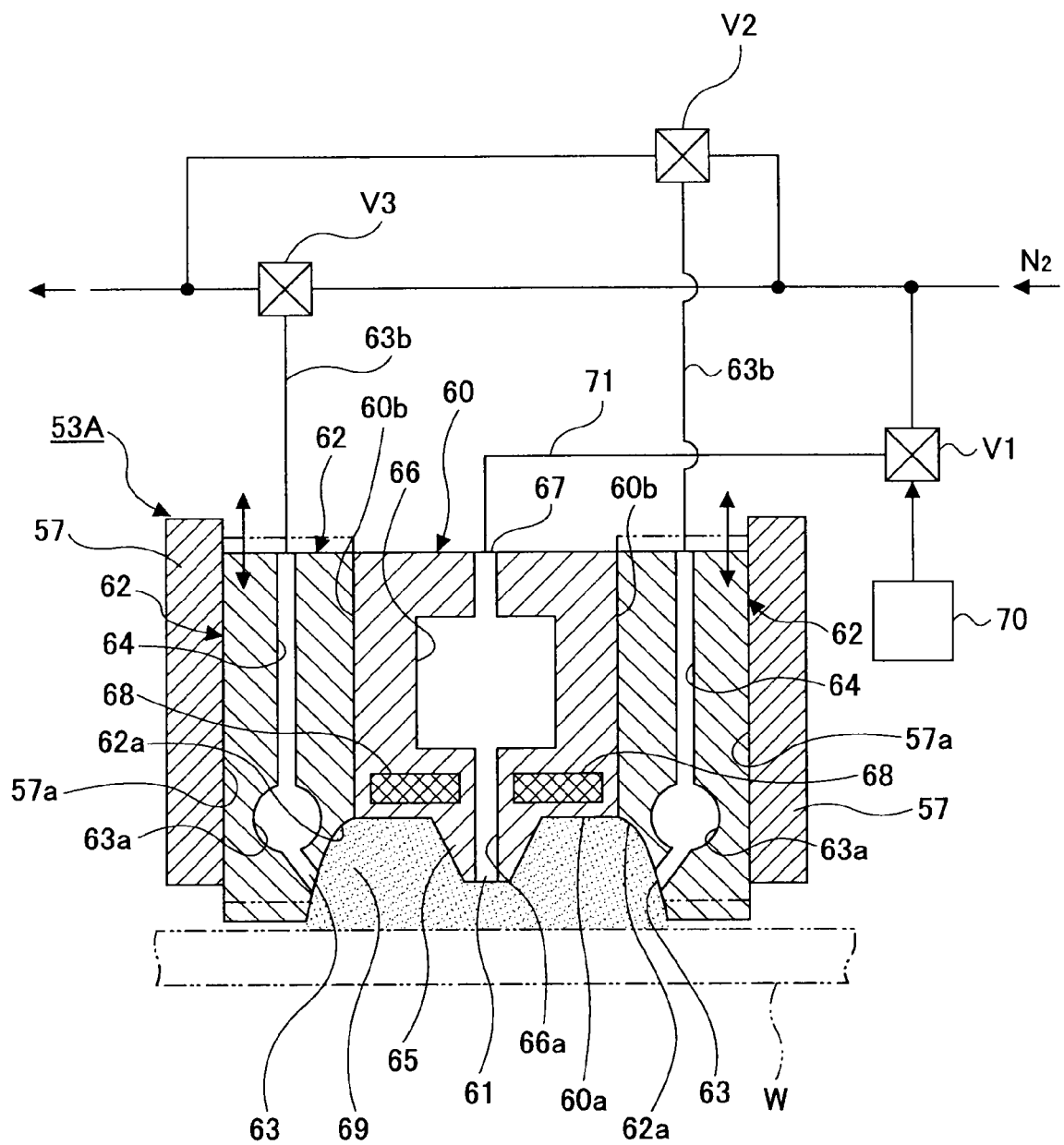
FIG. 8 shows a schematic cross section of a solvent vapor discharge nozzle in a substrate processing apparatus according to Embodiment 2 of the present invention.

FIG. 8 shows a schematic cross section of a nozzle 53A of a smoothing apparatus 50 according to a second embodiment of the invention.

In Embodiment 2, the leakage preventing portions 62 of the nozzle 53A can be moved vertically with respect to the nozzle head 60 for adjustment purposes. In this embodiment, the leakage preventing portions 62 are retained by retainers 57, with the nozzle head 60 held between the leakage preventing portions 62, in such a manner that the leakage preventing portions 62 can be moved slidably on side surfaces 60b of the nozzle head 60 and retaining surfaces 57a of the retainers 57.

Thus, the distance or interval between the discharge opening 61 of the nozzle 53 or the lower edges of the leakage preventing portions 62 and the wafer surface can be adjusted, thus enabling the adjustment of the supply or supply pressure of the solvent vapor, or the air flow at the supply portion.

The other portions of the second embodiment are similar to the corresponding portions of the first embodiment and are designated with similar reference numerals or signs, and their description is omitted.

Embodiment 3

Figure 9:
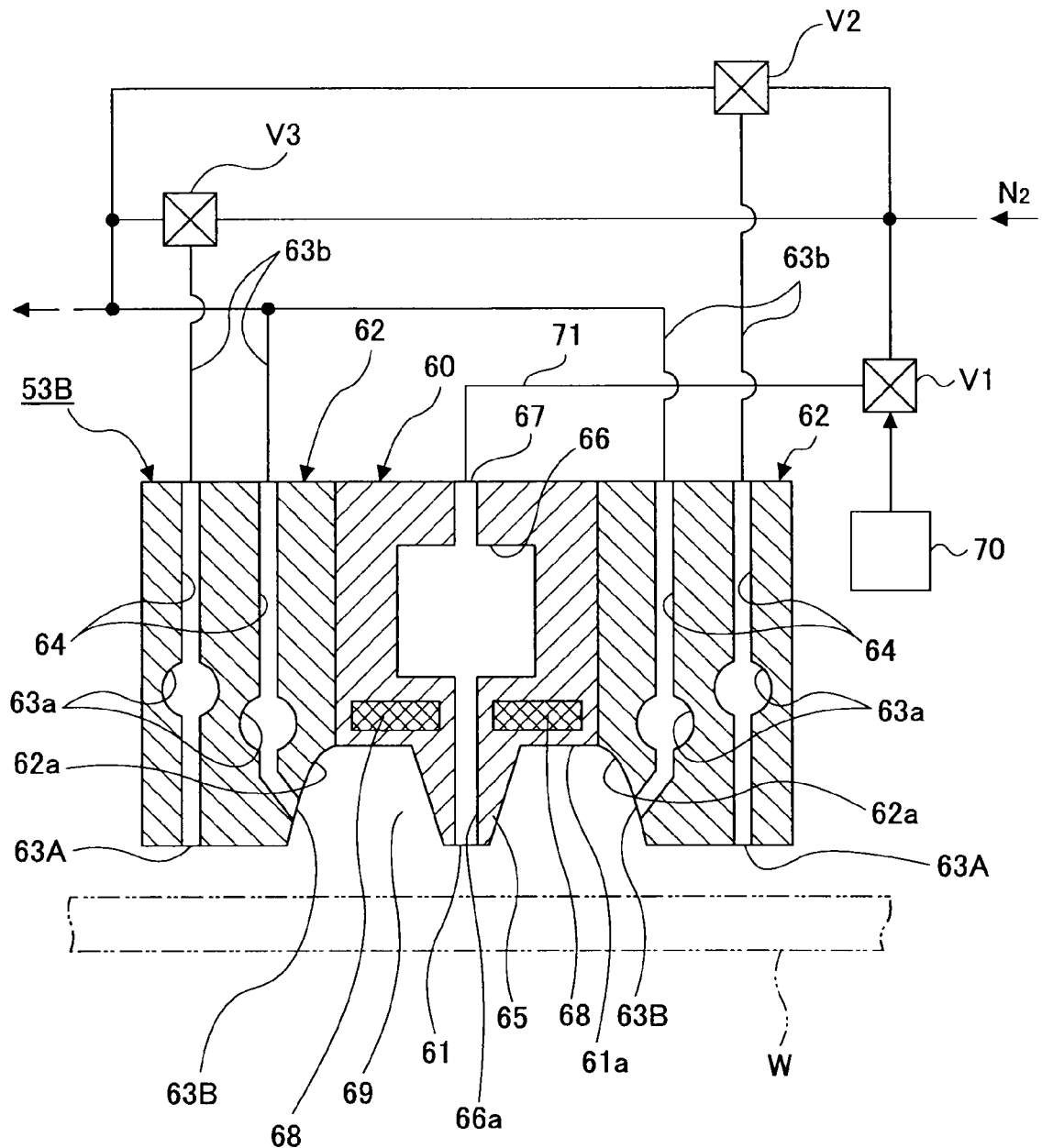
FIG. 9 shows a schematic cross section of a solvent vapor discharge nozzle in a substrate processing apparatus according to Embodiment 3.

FIG. 9 shows a schematic cross section of a nozzle 53B of a smoothing apparatus 50 according to Embodiment 3.

In Embodiment 3, a plurality of, such as two, openings are provided in each of the leakage preventing portions 62 of the nozzle 53B along a direction in which the nozzle 53B is moved. Specifically, by switching the valves V2 and V3, the outer opening 63A of each leakage preventing portion can be connected through the intake/supply piping 63b to the N2 gas supply source 80 of the solvent vapor blocking gas, and the inner opening 63B can be connected to the exhaust pump (not shown). In this case, preferably the outer openings 63A are provided on the lowermost surfaces of the leakage preventing portions 62. In this way, the N2 gas can be discharged (ejected) via the outer openings 63A vertically with respect to the wafer W, forming a blocking air curtain with which the leakage of the solvent vapor, as it is discharged out of the discharge opening 61, to the outside of the nozzle 53B can be reliably prevented.

Specifically, during processing, as shown in FIG. 10A, the N2 gas for blocking the solvent vapor is discharged out of the outer openings 63A, whereby a blocking air curtain is formed with which the leakage of the solvent vapor as it is discharged out of the discharge opening 61 can be prevented. After the processing, as shown in FIG. 10B, the N2 gas is discharged out of the discharge opening 61 while the inner and outer openings 63A and 63B are both connected to the exhaust pump, so that the N2 gas discharged out of the discharge opening 61 can be exhausted (collected) via the inner and outer openings 63A and 63B.

The other portions of Embodiment 3 are similar to the corresponding portions of the first embodiment and are designated with similar reference numerals, and their description is omitted.

Embodiment 4

Figure 11:
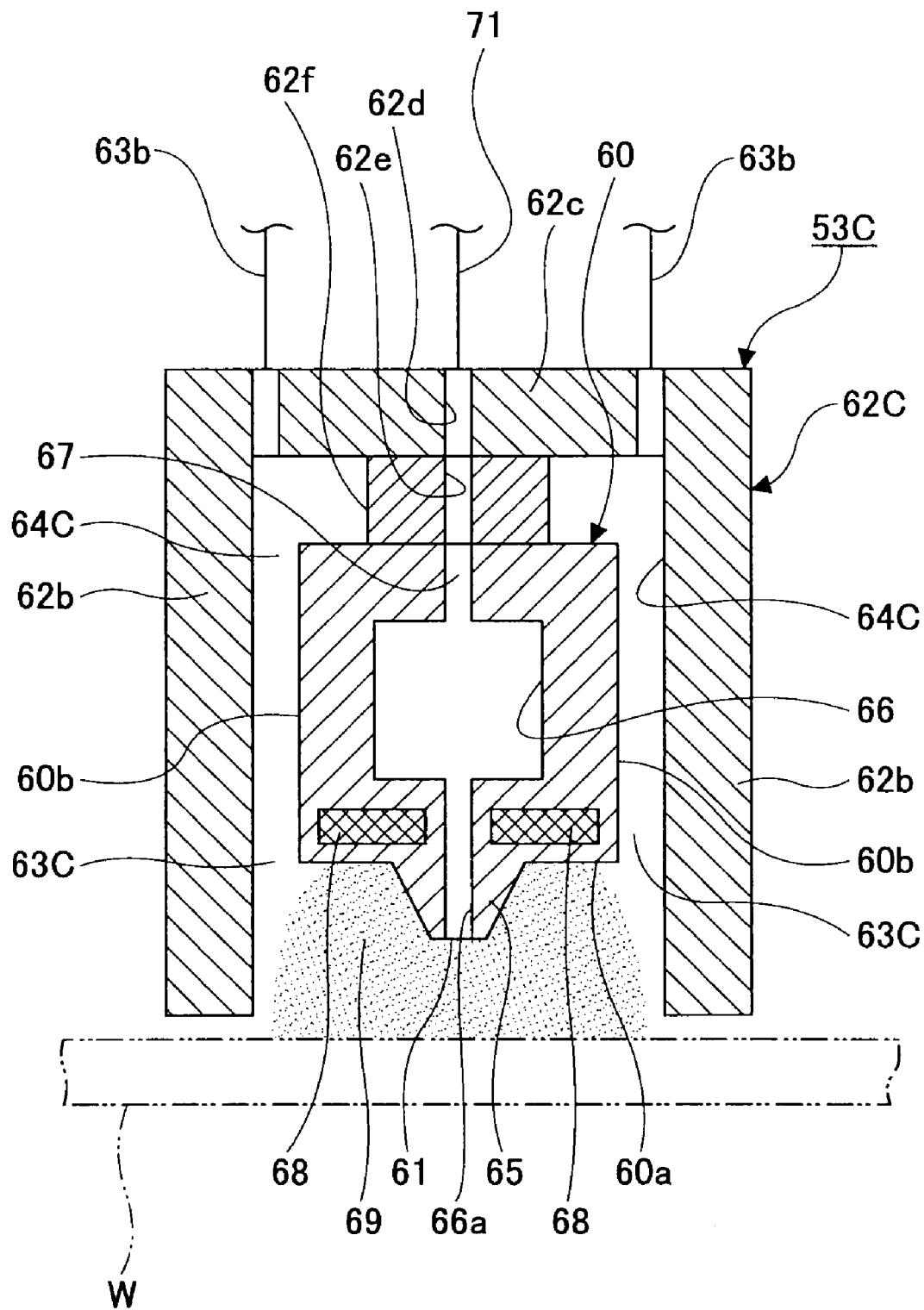
FIG. 11 shows a schematic lateral cross-section of a solvent vapor discharge nozzle in a substrate processing apparatus according to Embodiment 4 of the present invention.

FIG. 11 shows a schematic cross section of a nozzle 53C of a smoothing apparatus 50 according to Embodiment 4.

In Embodiment 4, the leakage preventing portions of the nozzle 53C are formed of an inverse-U shaped cover member 62C. The cover member 62C covers the nozzle head 60, leaving openings 63C and communicating channels 64C between the sides 60b of the nozzle head 60 and leg portions 62b of the cover member 62C. In a top member 62c of the cover member 62C, there is formed a communicating opening 62d that is in communication with the supply opening 67 of the nozzle head 60. The cover member 62C is fixedly mounted on top of the nozzle head 60 by a fixing member (not shown) via a spacer 62f having a communicating opening 62e.

In accordance with Embodiment 4, the openings 63C and the communicating channel 64C can be easily formed by covering the nozzle head 60 with the cover member 62C.

Figure 12:
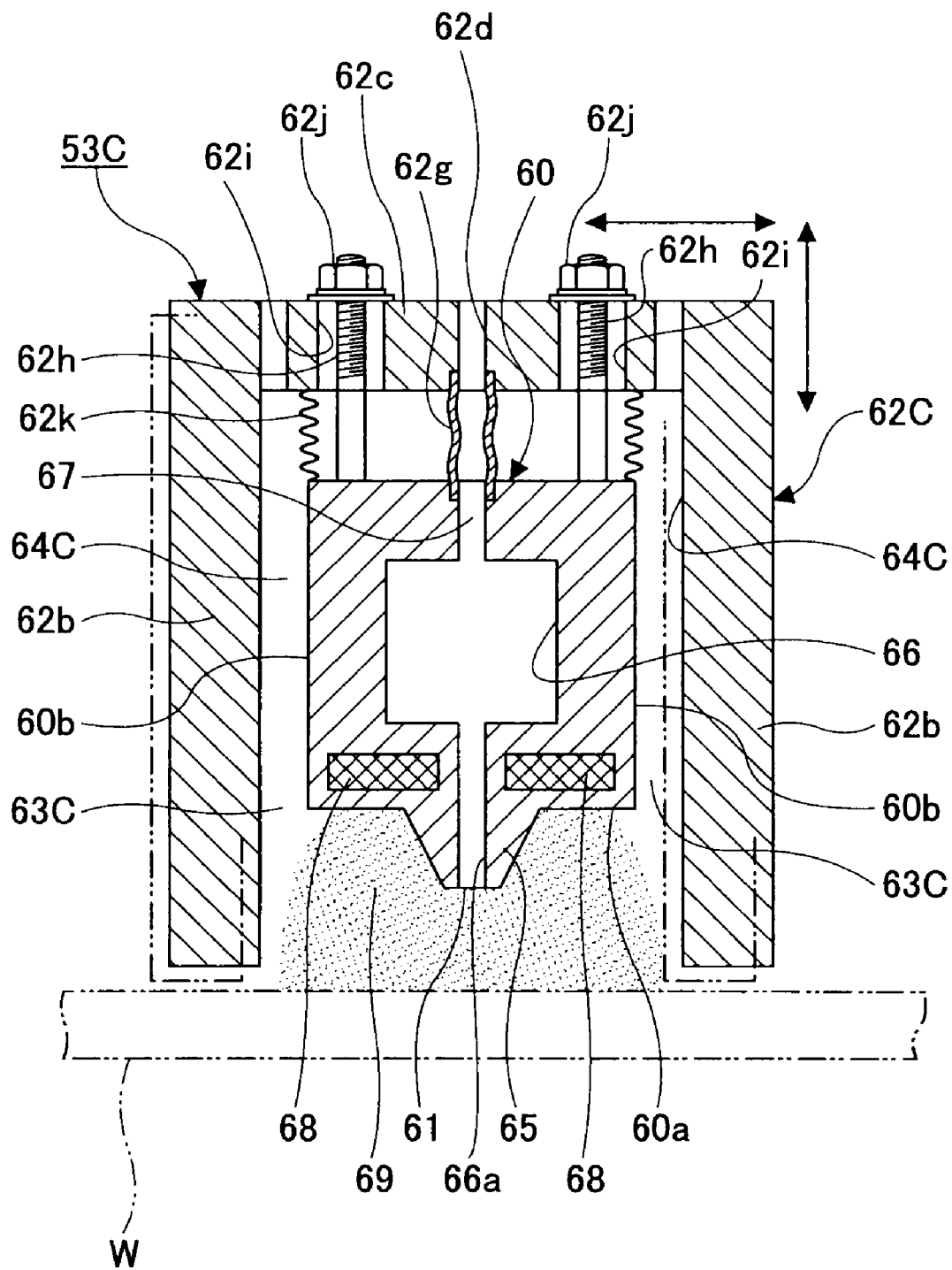
FIG. 12 shows a schematic cross section of a variation of the solvent vapor discharge nozzle according to Embodiment 4.

In a variation, as shown in FIG. 12, the cover member 62C and the nozzle head 60 may be relatively movably adjustable vertically and horizontally. In this embodiment, the communicating opening 62d provided in the top member 62c of the cover member 62C and the supply opening 67 in the nozzle head 60 may be connected via a flexible communicating piping 62g that can be elongated, compressed, and bent. In this case, mounting bolts 62h attached vertically on the upper surface of the nozzle head 60 may be freely movably inserted in elongated openings 62i in the top member 62c of the cover member 62C, where the projecting portions of the mounting bolts 62h are in threaded engagement with nuts 62j.

In this way, the cover member 62C can be fixed after it is moved and adjusted with respect to the nozzle head 60 vertically and horizontally. Between the nozzle head 60 and the top member 62c of the cover member 62C, a bellows tube 62k of polytetrafluoroethylene (PTFE), for example, for shielding fluid communication between the communicating channels 62C and the portion of the mounting bolts 62 may be installed.

Thus, the widths of the openings 63C and the communicating channels 64C can be adjusted, and also the distance or interval between the discharge opening 61 of the nozzle 53C or the wafer surface and the lower edges of the leg portions 62b of the cover member 62C can be adjusted. Thus, the supply pressure of solvent vapor and its flow from supply to exhaust can be adjusted.

The other portions of the fourth embodiment are similar to the corresponding portions of the first embodiment and are designated with similar reference numerals, and their description is omitted.

Embodiment 5

Figure 13:
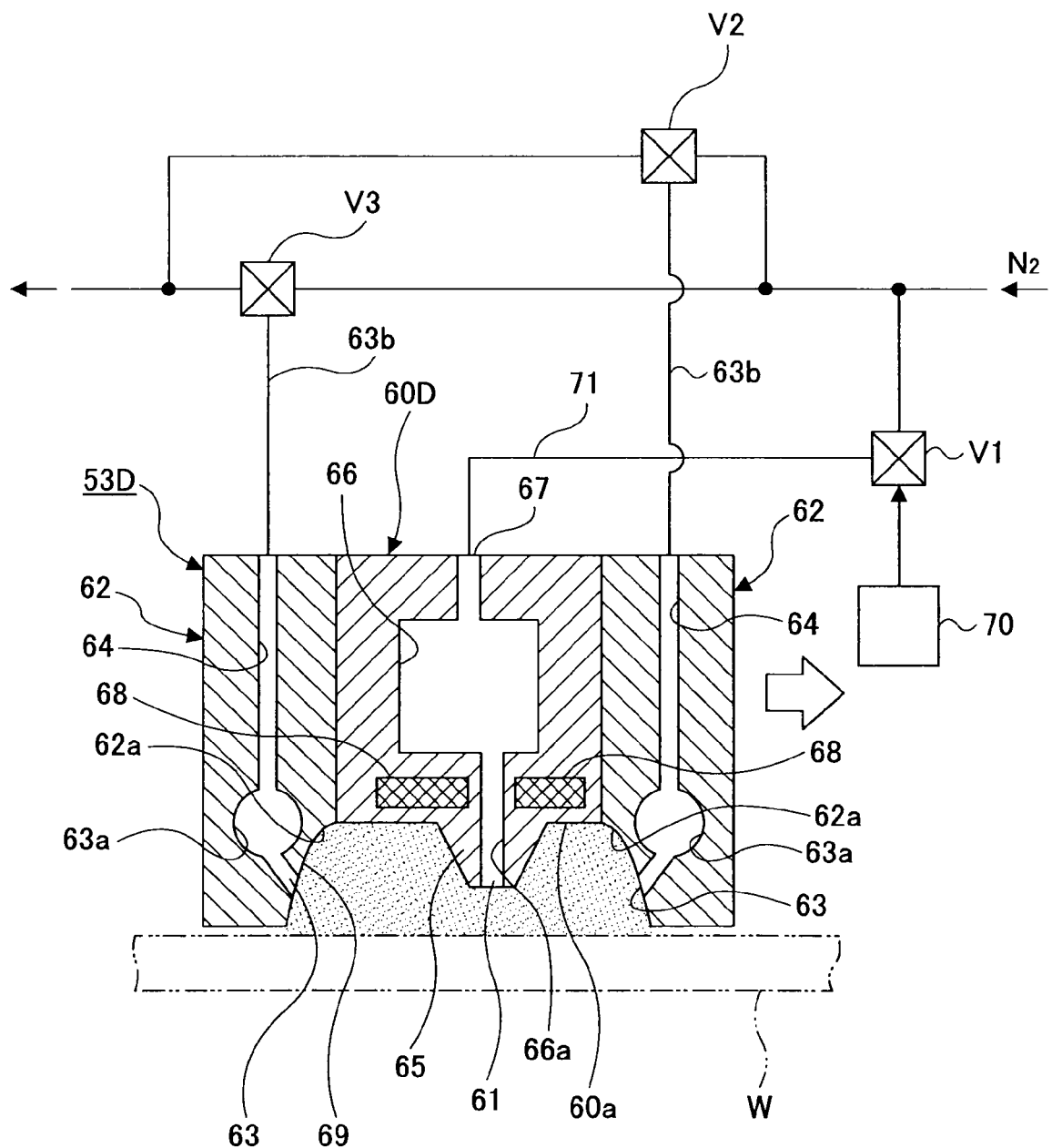
FIG. 13 shows a schematic cross section of a solvent vapor discharge nozzle in a substrate processing apparatus according to Embodiment 5 of the present invention.

FIG. 13 shows a schematic cross section of a nozzle 53D of a smoothing apparatus 50 according to Embodiment 5.

In accordance with Embodiment 5, the discharge opening 61 of the nozzle 53D is displaced in the direction of movement of the nozzle 53D. Namely, the supply portion 65 projecting from the bottom surface 60a of the nozzle head 60D of the nozzle 53D is displaced forwardly of the direction in which the nozzle 53D is moved.

In this structure, because the solvent vapor is discharged forwardly of the direction of movement of the nozzle 53D as the nozzle 53D moves relative to the wafer W, the solvent vapor can contact the wafer surface uniformly.

While this embodiment is based on the first embodiment where the nozzle head 60 of the nozzle 53 is replaced with the nozzle head 60D, the nozzle head 60D may replace the nozzle head 60 of any of Embodiments 2 through 4.

The other portions of Embodiment 5 are similar to the corresponding portions of Embodiment 1, so that the similar portions are designated with similar numerals and their description is omitted.

Other Embodiments

In the foregoing embodiments, the nozzle 53, 53A-53D is moved in parallel with the retaining base 52 that is fixed. Alternatively, the retaining base 52 may be moved in parallel with the nozzle 53, 53A-53D that is fixed. Further alternatively, both the retaining base 52 and the nozzle 53, 53A-53D may be moved relative to each other.

Figure 14A:
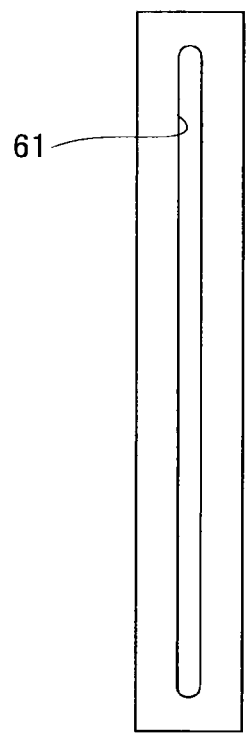
FIG. 14A shows a schematic bottom view of an example of a discharge opening.
Figure 14B:
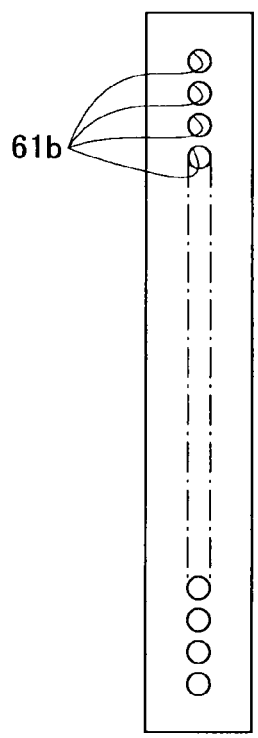
FIG. 14B shows a schematic bottom view of another example of the discharge opening.
Figure 14C:
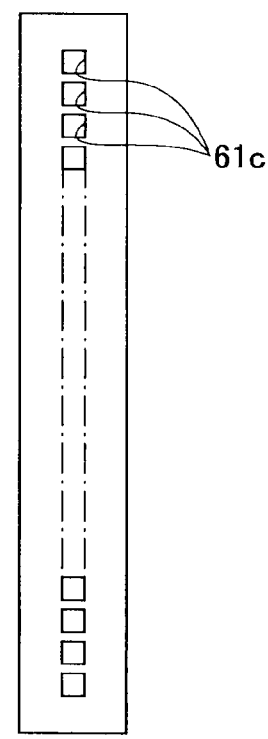
FIG. 14C shows a schematic bottom view of another example of the discharge opening.
Figure 14D:
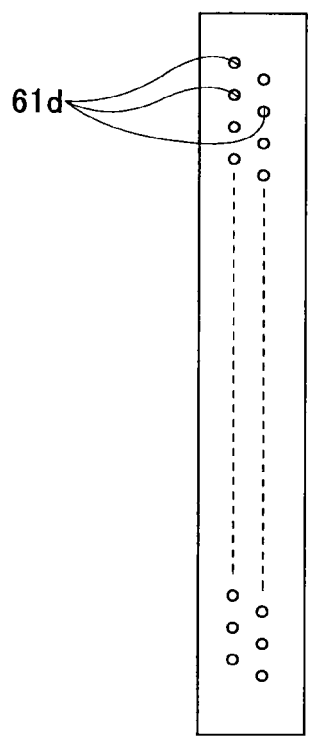
FIG. 14D shows a schematic bottom view of another example of the discharge opening.
Figure 14E:
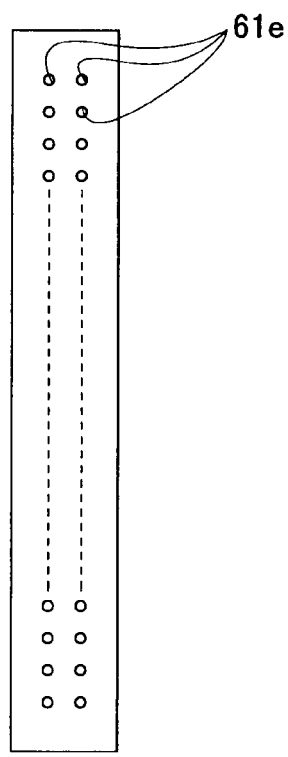
FIG. 14E shows a schematic bottom view of another example of the discharge opening.
Figure 14F:
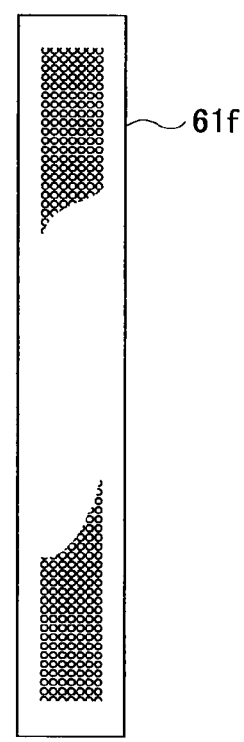
FIG. 14F shows a schematic bottom view of another example of the discharge opening.

While in the foregoing embodiments, the discharge opening 61 of the nozzle 53, 53A-53D is in the shape of a slit, as shown in FIG. 14A, the shape of the discharge opening is not limited to the slit. For example, as shown in FIG. 14B, a number of circular discharge openings 61b may be arranged at equal intervals in a region longer than the diameter of the wafer W. In another example, as shown in FIG. 14C, a number of square-shaped discharge openings 61c may be arranged at equal intervals in a region longer than the diameter of the wafer W. Alternatively, as shown in FIG. 14D, small circular discharge openings 61d may be arranged in a staggered manner in a region longer than the diameter of the wafer W. Further alternatively, as shown in FIG. 14E, small circular discharge openings 61e may be arranged in two rows in a region longer than the diameter of the wafer W. In yet another example, as shown in FIG. 14F, the discharge opening portion may be formed of a porous material 61f.

In the following, an operation of the resist applying/developing process system equipped with the smoothing apparatus 50 is described.

First, in the cassette station 10, the lid open/close device 5 is activated to open the lid of the wafer cassette 1 of a previous lot. The wafer transfer tweezers 4 then accesses the cassette 1 on the cassette mount 2, in which cassette 1 the unprocessed wafers W are contained. One of the wafers W is picked out of the cassette 1 by the wafer transfer tweezers 4, which then move to the alignment unit (ALIM) among the multi-stage units in the third group G3 on the side of the process station 20, and places the wafer W on the wafer mount 24 in the alignment unit (ALIM). The wafer W placed on the wafer mount 24 is aligned with respect to the orientation flat and centered. Thereafter, the main wafer transfer mechanism 21 accesses the alignment unit (ALIM) from the opposite side and receives the wafer W from the wafer mount 24.

In the process station 20, the main wafer transfer mechanism 21 initially loads the wafer W into the adhesion unit (AD) of the multi-stage units of the third group G3. Within the adhesion unit (AD), the wafer W is subjected to a hydrophobic process. After the hydrophobic process, the main wafer transfer mechanism 21 unloads the wafer W from the adhesion unit (AD), and loads it into the cooling unit (COL) that belongs to the multi-stage units of the third group G3 or the fourth group G4. Within the cooling unit (COL), the wafer W is cooled down to a certain temperature, such as 23° C., that is set before the resist application process. After the cooling process, the main wafer transfer mechanism 21 unloads the wafer W from the cooling unit (COL), and then loads it into the resist applying unit (COT) that belongs to the multi-stage units of the first group G1 or the second group G2. Within the resist applying unit (COT), the surface of the wafer W is coated with a uniform thickness of resist by spin coating.

After the resist application process, the main wafer transfer mechanism 21 unloads the wafer W out of the resist applying unit (COT), and then loads it into the hot plate unit (HP). In the hot plate unit (HP), the wafer W is placed on a mount and prebaked at a predetermined temperature, such as 100° C., for a predetermined time. As a result, the remaining solvent is evaporated and removed from the coated film on the wafer W.

After the prebaking process, the main wafer transfer mechanism 21 unloads the wafer W from the hot plate unit (HP), and then transports it to the extension/cooling unit (EXTCOL) that belongs to the multi-stage units of the fourth group G4. In this unit (EXTCOL), the wafer W is cooled down to a temperature suitable for the edge exposure process in the edge exposure apparatus 33 in the next step, such as 24° C.

Thereafter, the main wafer transfer mechanism 21 transports the wafer W to the extension unit EXT immediately above, and places the wafer W on a mount (not shown) in the unit EXT. Upon placement of the wafer W on the mount in the extension unit (EXT), the transfer arm 34 of the interface unit 30 accesses from the opposite side and receives the wafer W. The transfer arm 34 then loads the wafer W into the edge exposure apparatus 33 in the interface unit 30. In the edge exposure apparatus 33, the excess resist film (portion) on the edge of the wafer W surface is irradiated with light.

Following the edge exposure, the transfer arm 34 unloads the wafer W from within the casing of the edge exposure apparatus 33, and transfers it to a wafer receiving base (not shown) on the side of the adjacent exposure apparatus 40.

After the wafer W is entirely exposed by the exposure apparatus 40 and returned to the wafer receiving base on the side of the exposure apparatus 40, the transfer arm 34 of the interface unit 30 accesses the wafer receiving base and receives the wafer W. The transfer arm 34 then loads the wafer W into the extension unit (EXT) that belongs to the multi-stage units of the fourth group G4 on the side of the process station 20, and places it on the wafer receiving base.

The wafer W placed on the wafer receiving base is transported into the chilling hot plate unit (CHP) by the main wafer transfer mechanism 21. In the chilling hot plate, the wafer W is subjected to a post-exposure bake process at 120° C., for example, for a predetermined time, in order to prevent the development of a fringe or to induce an acid catalytic reaction in the case of a chemical amplification resist (CAR).

Thereafter, the wafer W is loaded into the developing unit (DEV) that belongs to the multi-stage units of the first group G1 or the second group G2. In the developing unit (DEV), a developing solution is uniformly supplied to the resist on the wafer W surface in order to perform a developing process. The developing process develops the resist film formed on the wafer W surface into a predetermined circuit pattern. The developing process also removes the excess resist film on the edge portion of the wafer W, and the resist film that is attached to the region of the alignment mark M formed (or provided) on the wafer W surface. Thereafter, the wafer W surface is rinsed with a rinsing solution to remove the developing solution.

After the developing step, the main wafer transfer mechanism 21 unloads the wafer W out of the developing unit (DEV) and loads it into the smoothing apparatus 50. In the smoothing apparatus 50, the wafer W is retained on the retaining base 52 with its upper surface facing upward. Then, as described above, the retaining base 52 and the nozzle 53 make relative movements while the nozzle 53 discharges a solvent vapor (such as acetone, propylene glycol monomethyl ether acetate (PGMEA), or N-methyl-2-pyrrolidinone (NMP) onto the resist pattern on the wafer surface, whereby the resist pattern is swelled and the irregularities on the resist pattern surface are smoothed.

The smoothing process is described with reference to Embodiment 1. During the smoothing process, as shown in FIG. 7A, the solvent vapor is discharged out of the discharge opening 61, and the N2 gas is discharged out of the opening 63 forwardly of the direction of movement of the nozzle 53. At the same time, the solvent vapor and the N2 gas that have been used in the process are sucked (collected) by the rear opening 63. After the processing, the N2 gas is discharged out of the discharge opening 61 as shown in FIG. 7B, with the nozzle 53 stopped over the runup surface 55, in order to replace the solvent vapor that remains in the discharge opening 61 portion with the N2 gas and suck (collect) the solvent vapor via the openings 63.

Following the smoothing process, the main wafer transfer mechanism 21 unloads the wafer W out of the smoothing apparatus 50, and loads it into the hot plate unit (HP) that belongs to the multi-stage units of the third group G3 or the fourth group G4. In this unit (HP), the wafer W is subjected to a post bake process at 100° C., for example, for a predetermined time. As a result, the resist that has been swelled by the developing process is cured so that improved chemical resistance can be obtained.

After the post bake process, the main wafer transfer mechanism 21 unloads the wafer W out of the hot plate unit (HP), and loads it into one of the cooling units (COL). In the cooling unit (COL), the wafer W returns to normal temperature, and then the main wafer transfer mechanism 21 transports the wafer W to the extension unit (EXT) that belongs to the third group G3. Upon placement of the wafer W on a mount (not shown) of the extension unit (EXT), the wafer transfer tweezers 4 on the side of the cassette station 10 access the wafer W from the opposite side, and receive the wafer W. The wafer transfer tweezers 4 put the wafer W in a predetermined wafer accommodating slot in the wafer cassette 1 on the cassette mount for accommodating processed wafers. After all of the processed wafers W are accommodated within the wafer cassette 1, the lid open/close device 5 is activated to close the lid, whereupon the process is completed.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

The present application is based on the Japanese Priority Application No. 2007-298960 filed Nov. 19, 2007, the entire contents of which are hereby incorporated by reference.

What is claimed is:

1. A substrate processing apparatus comprising:
 a substrate retaining base configured to retain a substrate with a surface facing upward, wherein a resist pattern is formed on the surface that is subjected to an exposure process and a developing process;

a nozzle configured to discharge a solvent vapor onto the surface of the substrate in order to swell the resist pattern; and a moving mechanism configured to move the substrate retaining base and the nozzle in parallel relative to each other, wherein the nozzle includes a nozzle head having a solvent vapor supply opening and a discharge opening that is communicated with the solvent vapor supply opening and that opens downward, the nozzle further including a pair of leakage preventing portions disposed at opposite positions across the nozzle head, wherein each of the leakage preventing portions has an opening via which at least the solvent vapor discharged out of the discharge opening can be sucked, and a communicating channel in communication with the opening of the leakage preventing portion, wherein a solvent vapor supply source and an inert gas supply source are switchably connected to the supply opening of the nozzle head via a first switching valve, and wherein an exhaust mechanism and a solvent-vapor-blocking gas supply source are switchably connected to the opening of each of the leakage preventing portions via a second switching valve.

2. The substrate processing apparatus according to claim 1, wherein a lower portion of each of the leakage preventing portions extends downward beyond the discharge opening of the nozzle head, and wherein a surface of each of the leakage preventing portions that is continuous with a bottom surface of the nozzle head is formed as a concave-curved surface in which the opening of the leakage preventing portion is located.

3. The substrate processing apparatus according to claim 1, including a dew-condensation-preventing heater disposed on either side of the discharge opening in the nozzle head.

4. The substrate processing apparatus according to claim 1, wherein the leakage preventing portions are movable vertically with respect to the nozzle head.

5. The substrate processing apparatus according to claim 1, wherein each of the leakage preventing portions has an inner opening and an outer opening disposed along a direction of movement of the nozzle, wherein the outer opening of the leakage preventing portion is switchably connected to the exhaust mechanism and the solvent-vapor-blocking gas supply source via the second valve, and the inner opening of the leakage preventing portion is connected to the exhaust mechanism.

6. The substrate processing apparatus according to claim 1, wherein the leakage preventing portions are formed of a cover member with which the nozzle head is covered, leaving an opening and a communicating channel between the nozzle head and the cover member, wherein a top member of the cover member has a communicating opening communicated with the supply opening of the nozzle head.

7. The substrate processing apparatus according to claim 6, wherein the cover member and the nozzle head are relatively movable vertically and horizontally, and wherein the communicating opening in the top member of the cover member and the supply opening in the nozzle head are connected via a communicating piping that can be expanded, compressed, and bent.

8. The substrate processing apparatus according to claim 1, wherein the discharge opening of the nozzle head is displaced forwardly of a direction of movement of the nozzle.

9. The substrate processing apparatus according to claim 1, further comprising a control unit configured to control the moving mechanism, the first switching valve, the second switching valve, and the exhaust mechanism.

* * * * *